United States Patent [19]

Momose et al.

[11] 4,032,341

[45] June 28, 1977

[54] PATTERN EXPOSURE USING A POLYCHROMATIC LIGHT SOURCE

[76] Inventors: Katsumi Momose, 555, Nagata-cho, Minami, Yokohama, Kanagawa; Kazuhisa Okutsu, 2441, Totsuka-cho, Yokohama, Kanagawa, both of Japan

[22] Filed: Nov. 6, 1975

[21] Appl. No.: 629,561

Related U.S. Application Data

[63] Continuation of Ser. No. 429,904, Jan. 2, 1974, abandoned.

[30] Foreign Application Priority Data

Jan. 16, 1973 Japan .............................. 48-7207

[52] U.S. Cl. ............................. 96/27 E; 96/27 R; 96/36; 96/36.2; 96/38.4; 96/47
[51] Int. Cl.² ...................... G03C 5/04; G03C 5/00
[58] Field of Search .......... 96/36, 36.2, 27 R, 27 E, 96/38.4, 47

[56] References Cited

UNITED STATES PATENTS 3,576,630  4/1971  Yanagawa ........................ 96/36.2
3,669,732  6/1972  Middelhoek et al. ............. 96/36.2

*Primary Examiner*—Edward C. Kimlin

[57] ABSTRACT

An exposure method for exposing to a pattern a photosensitive material formed over a substrate having a reflective surface uses a light source having beam components of different wavelengths. The beam from the light source is used to project an exposure pattern upon the photosensitive material through a predetermined mask pattern to thereby form a combined standing wave pattern with the aid of the light beam incident on the photosensitive material and the light beam reflected by the reflective surface. The photosensitive material is disposed in the reduced peak value region of the combined standing wave pattern as the result of the interposition of a transparent layer between the reflecting surface and the photosensitive layer. Thus, the photosensitive material is pattern-exposed to a substantially uniform sensitizing energy.

7 Claims, 8 Drawing Figures

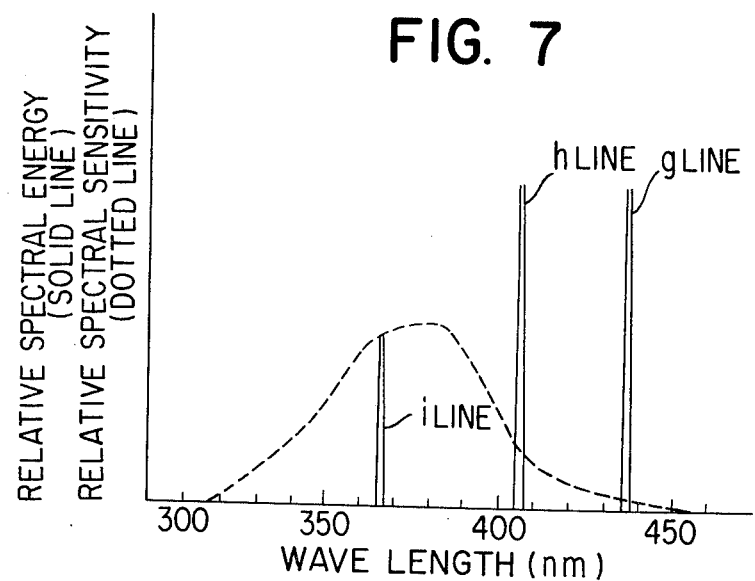
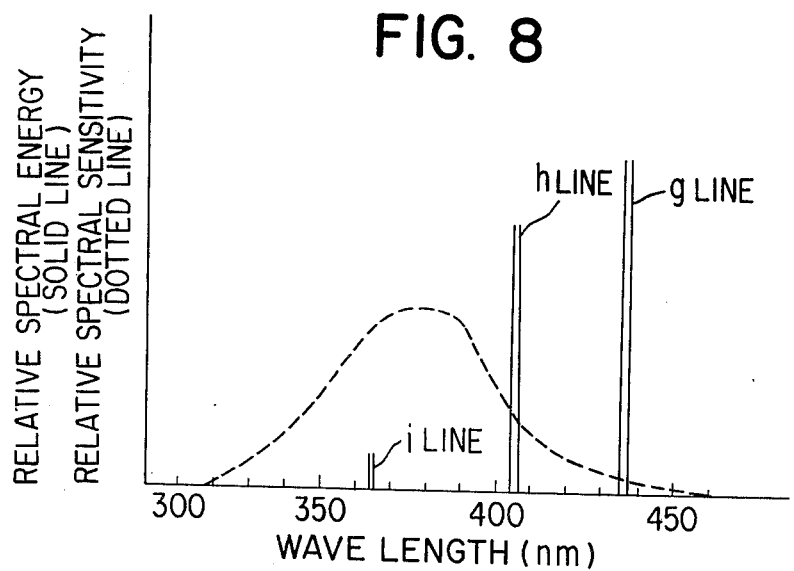

PATTERN EXPOSURE USING A POLYCHROMATIC LIGHT SOURCE

This is a continuation of application Ser. No. 429,904, filed Jan. 2, 1974 now abandoned.

BACKGROUND OF THE INVENTION

1. Field of the Invention

This invention relates to a pattern exposure method using a polychromatic light source, and more particularly to a pattern exposure method whereby a predetermined amount of sensitizing energy may be imparted to a photosensitive layer.

2. Description of the Prior Art

The pattern print-out methods heretofore used for the formation of semiconductor integrated circuits or the like are generally grouped into two types, that is, the contact print-out method and the projection print-out method.

The former method has long been known and comprises bringing a pattern and a pellet or like element having a photosensitive layer on which print-out is to be effected into intimate contact with each other, and applying a uniform irradiation to the pattern to thereby print out the image of the pattern on the photosensitive layer. According to this method, the pattern and the photosensitive layer are brought into intimate contact with each other and this eliminates the need to provide a focusing lens between the print-out light source and the pattern, with a result that the print-out light source is free from the problem of chromatic aberration. Thus, a polychromatic light source having two or more wavelength components may be used as the print-out light source and this necessarily leads to a merit that the high brightness of such light source reduces the length of time required for the print-out. On the other hand, however, the high brightness of such light source might result in an adverse effect such as turn-about of the light unless good contact is maintained between the photosensitive layer and the pattern.

In the latter method, the pattern to be printed out is placed in spaced relationship with the photosensitive layer and the pattern image formed by illuminating the pattern with the light source is focused on the photosensitive layer through a focusing lens. According to such method, the pattern need not always be equal in size to the pattern image to be printed out on the photosensitive layer but the pattern image may be reduced in size by means of the focusing lens. Thus, this latter method is effective especially where an extremely miniature pattern is to be printed out. However, the optical means such as focusing lens or the like which is indispensable to this method involves the problem of chromatic aberration and thus, the light source available for this method is restricted to a monochromatic light source or at best to a dichromatic light source if used with a lens for the correction of chromatic aberration. Such light source is necessarily low in brightness, and this in turn leads to an undesirably increased time required to print out a predetermined pattern, thus resulting in a reduced efficiency of operation. Moreover, where the pattern print-out is carried out for a long period of time, fogging of the resultant print occurs because the turnabout of the light is far more serious than in the former method.

Further, the above-described two methods suffer from a common problem which occurs where a substrate such as aluminum, silicon, or like material having a substantial reflecting characteristic, is provided on the back side of the photosensitive layer. If the back side of the photosensitive layer is provided with a reflective surface, the pattern light thrown upon the photosensitive layer is partly absorbed in the photosensitive layer, whereafter the unabsorbed part of the light beam passes through the photosensitive layer and is reflected from the reflective surface to create polymerization in cooperation with the incident light.

Where the light source in use is a monochromatic light source, a standing wave is created within the photosensitive layer and the sensitized amount of the photosensitive layer differs from peak to peak, i.e. from the summit to the valley of the energy distribution of the standing wave. Such phenomenon occurs not only with a monochromatic light source but also with a polychromatic light source. However, in case of a polychromatic light source, which has a high degree of brightness, it is very likely that the photosensitive layer is sufficiently sensitized by the small amount of sensitizing energy present in the valleys of the standing wave and thus, the regions of the photosensitive layer corresponding to the summits of the standing wave are subjected to overexposure. Therefore, in case of a photoresist layer of photosensitive material in an integrated circuit pattern having no half tone, the variation in the energy distribution of the standing wave would result in no irregular exposure if the small sensitizing energy in the valleys of the standing wave is at a sufficient level to completely sensitize the photosensitive layer. However, in case of a monochromatic or dichromatic light source which is not so high in brightness or in case where a polychromatic light source is used with the exposure time reduced, it is impossible to accomplish pattern print-out with the aid of a uniform energy distribution of the standing wave.

A conventional pattern print-out device, especially one which adopts the projection print-out method, is schematically shown in FIG. 1 of the accompanying drawings. This includes a light source 1, and a filter plate 2 having filters $2_1$ and $2_2$ formed in marginal portions thereof. The filter $2_1$ passes therethrough only the light which does not sensitize the photoresist layer of photosensitive material which will be described further, and the filter $2_2$ passes therethrough the light which sensitizes the photosensitive layer. The device further includes a reflector plate 3, a collimater lens 4, a pattern 5 to be printed out, a half-mirror 6 for viewfinder, a focusing lens 7, semiconductor wafer 8 comprising a silicon substrate 9 covered with a layer 10 of $SiO_2$ which in turn is covered with a photoresist layer 11, and a viewfinder's optical system 12–14. Alignment between the pattern 5 and the wafer 8 is effected by means of viewfinder's eyepiece 14, and then the filter $2_2$ is disposed in the optical path between the light source 1 and the mirror 3, whereby the image of the pattern 5 is projected through the focusing lens 7 upon the photoresist layer of the wafer 8. The photoresist layer and the $SiO_2$ layer are substantially equivalent optically and have substantially the same refractive index, so that the print-out light beam impinging on the wafer 8 passed through the photoresist layer 11 and the $SiO_2$ layer to the silicon substrate 9. Since the silicon has a reflective index of about 30 percent, the reflected light from the surface of the silicon layer polymerizes in cooperation with the incident light to produce a standing wave as shown in FIG. 3. As a result, within the photoresist layer, the energy distribution of the light beam for sensitizing such layer is varied in the direction of the thickness of the layer 11 by the standing wave.

Where the photoresist layer is formed of a photosensitive resin material having a photo-polymerization characteristic, as is usually the case, the sensitizing energy differs from the summits to the valleys of the standing wave shown in FIG. 3, and this necessarily leads to the difference in the amount of photo-polymerization in the direction of the thickness of the photoresist layer. After the above-described print-out process, when the photoresist layer is developed by a chemical treatment, the portion of the photoresist layer which has not been exposed to the light is removed. However, the amount of photo-polymerization is variable in the interface of the photoresist layer to be removed, as described above, so that the wafer obtained after the etching process will present fine wrinkles in the interface after removal of the photoresist layer, as is indicated by dotted lines in FIG. 4. Thus, even if the resist layer 11 indicated by the dotted lines in FIG. 4 is removed, the $SiO_2$ layer will also present a rugged contour as a result of the non-uniform etching effect Thus, precise etching of the pattern image cannot be achieved.

Especially, where the pattern to be printed out is extremely miniature, the wrinkles so formed would prevent precise representation of the pattern to be printed out and thus, highly accurate print-out would be impossible.

In addition to the above-described contact print-out method and projection print-out method, there is known the off-contact print-out system which is an intermediate between the two methods. This system is such that print-out is effected with the pattern to be printed out being spaced apart slightly, say, several tens of microns, from the photosensitive material or, during the manufacture of integrated circuits, the photoresist layer applied to the semiconductor chip. According to this system, the contrast of the pattern image projected upon the photosensitive material is lower than in the contact print-out system, as is well known. This is attributable to the fact that a monochromatic light source comprising a specific wavelength is most preferred in this system because the use of other various light sources for print-out suffers from the problem of diffraction. Therefore, if print-out is to be effected on the surface of a print-out chip having a reflective surface provided by the lower surface of the photosensitive layer as described above, the amount of exposure will differ from the valleys of the resultant standing wave having a low intensity of sensitizing energy to the summits of the standing wave having a high intensity of sensitizing energy. Thus, if an energy sufficient to sensitize the valleys of the standing wave is imparted, the regions subjected to a sensitizing energy corresponding to the summits of the standing wave will be overexposed so that precise representation of a miniature pattern will be impossible, as will be appreciated from the foregoing description. Especially, where a photosensitive resin material having a photo-polymerization characteristic is used as the photoresist, the pattern width subjected to the over-exposure will be greater than the pattern to be printed out. Thus, the off-contact system suffers from a disadvantage quite similar to that peculiar to the projection print-out method.

SUMMARY OF THE INVENTION

The present invention intends to overcome all the above-noted disadvantages peculiar to the prior art and to provide a pattern exposure method which uses a light source having two or more different wavelengths and also employs a wafer comprising a substrate having a reflective surface and a photosensitive layer with a light-transmitting layer interposed between the reflective surface of the substrate and the photosensitive layer the light-transmitting layer having a predetermined thickness of the order of the wavelength of the light beam from the light source and having a refractive index substantially equal to that of the photosensitive layer, whereby a standing wave may be produced with its reduced peak range existing within the photosensitive layer to thereby enable pattern exposure to be effected by a uniform sensitizing energy.

Formation of a standing wave by polymerizing with two lights of different wavelengths is well-known in the art. The present invention not only utilizes that such well-known principle but also provides the back side of the photosensitive layer with a light-transmitting layer of $SiO_2$ or like material optically equivalent to the photosensitive layer so that the photosensitive layer to be exposed is located chiefly in a region where the peak value of the standing wave is substantially constant with the least energy variation. The thickness of the light-transmitting layer is suitably selected to provide such an energy distribution of the standing wave that the sensitizing energy is substantially constant within the photosensitive layer. Such energy distribution is utilized to accomplish exposure. Thus, the present invention ensures the sensitizing energy within the photosensitive layer to be of a substantially constant intensity which is a mean value of the peak energy values at the summits and valleys of the standing wave, whereby the sensitizing energy components may be relatively great and reduce the time required for the exposure to be accomplished.

In the present invention, if a print-out light source having a wavelength $\lambda_1$ were used, the energy effective to print the photosensitive layer would be $I\lambda_1 S\lambda_1$ which is the product of the energy $I\lambda_1$ applied to the material of the photosensitive layer and the spectral sensitivity $S\lambda_1$ of such material.

Therefore, if a print-out light source having wavelengths $\lambda_n$ ($n=1, 2, \ldots n$) were used, the effective energy would be $I\lambda_n S\lambda_n$ ($n=1, 2, \ldots n$). Empirically, it has been found that, if a polychromatic light source such as superhigh pressure mercury arc lamp is used as the print-out light source, and if the energies $I\lambda_g$, $I\lambda_h$ and $I\lambda_i$ in the g-, h- and i-lines of the light emitted from such source are selected to suitable levels, and if photo-polymerizing photosensitive resin is employed as the photosensitive material, then an optimal standing wave is created when $I\lambda_g S\lambda_g$, $I\lambda_h S\lambda_h$ and $I\lambda_i S\lambda_i$ are equal to one another, where $S\lambda_g$, $S\lambda_h$ and $S\lambda_i$ are the spectral sensitivities of the photosensitive material which contribute to the photo-polymerization. Generally speaking, it has been found that an optimal condition is obtained when the energy $I\lambda_n S\lambda_n$ of the wavelengths $\lambda_n$ effective for a photosensitive material is constant.

The invention will become more fully apparent from the following detailed description thereof taken in conjunction with the accompanying drawings.

BRIEF DESCRIPTION OF THE DRAWINGS

FIG. 7 graphically shows the distribution of the spectral energies emitted from a superhigh pressure mercury arc lamp employed in the device of FIG. 6.

FIG. 8 graphically shows the distribution of the spectral energies after the light described in FIG. 7 has passed through the filter in the device of FIG. 6.

DESCRIPTION OF THE PREFERRED EMBODIMENTS

Reference has already been made to FIGS. 1 to 4.

Figure 1:
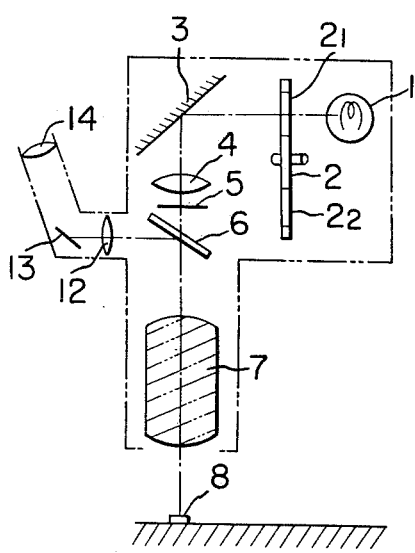
FIG. 1 schematically illustrates the principle and construction of a projection print-out device.
Figure 3:
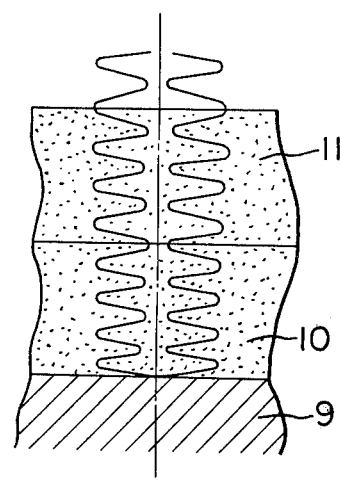
FIGS. 2, 3 and 4 illustrate how the sensitizing energy within the photosensitive material is provided according to the exposure method of the prior art.
Figure 2:
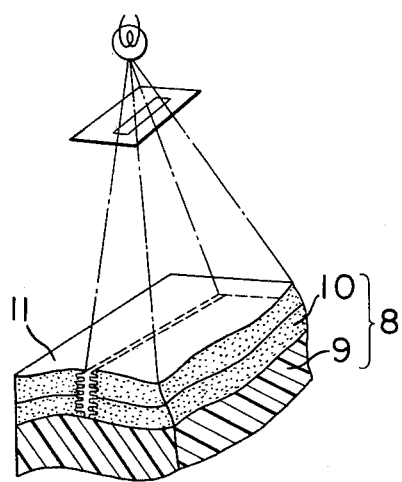
Figure 4:
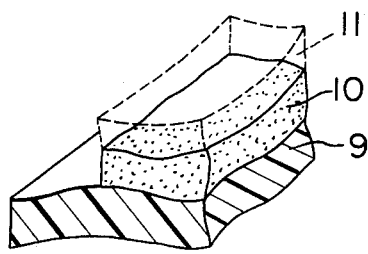
Figure 5:
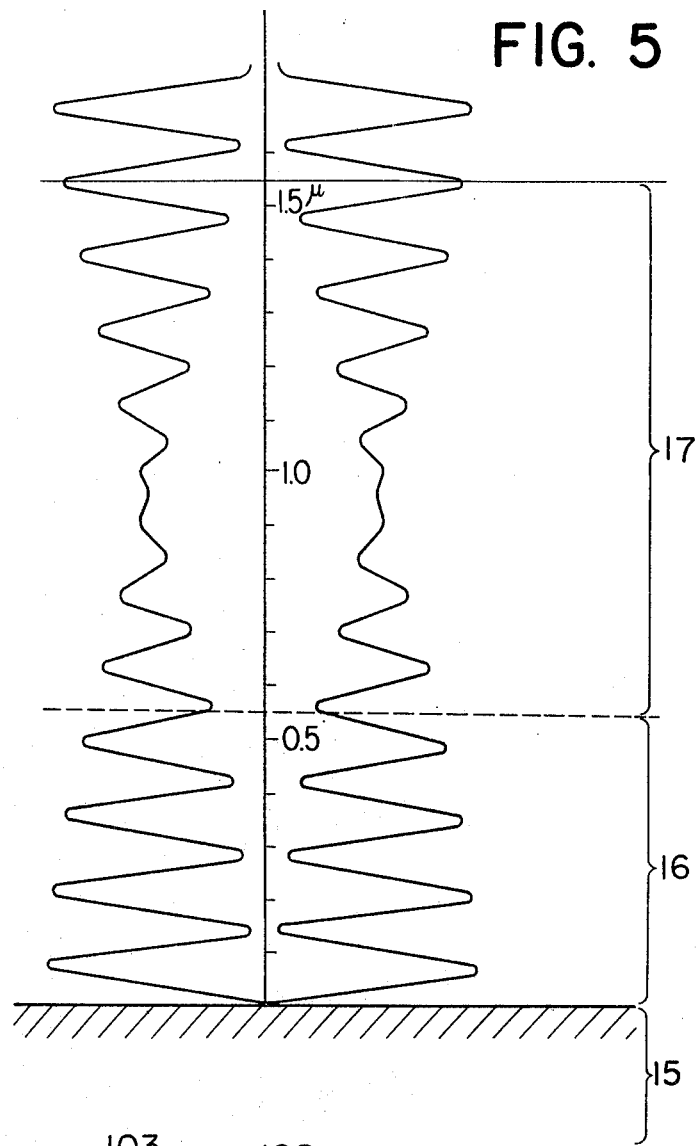
FIG. 5 illustrates how the distribution of the sensitizing energy within the photosensitive layer is provided by the exposure method of the present invention.

Referring now to FIG. 5, there is shown in contrast to FIG. 3 an example of the practice of the present invention which employs a superhigh pressure mercury arc lamp as the light source 1 shown in FIG. 1, and more specifically employs two colors of g-line (wavelength 436 mm) and h-line (wavelength 405 mm) produced by the mercury arc lamp 1 of FIG. 1.

The semiconductor wafer used in the method of the present invention comprises, as is shown in FIG. 5, a substrate of silicon 15, a layer 16 of $SiO_2$ formed on the substrate 15, and a photosensitive photoresist layer 17 formed on the $SiO_2$ layer 16. The $SiO_2$ layer 16 has a thickness of 0.55 and the photoresist layer 17 has a thickness of 1 $\mu$. When a pattern image is projected upon the wafer by the light from the light source, as will be seen in FIG. 5, the standing wave formed within the photoresist layer 17 and $SiO_2$ layer 16 has its peak value varied in the region up to 0.5 $\mu$ from the surface of the silicon layer 15 and the energy fluctuation is great in such region, while the energy becomes uniform in the region of 0.8 to 1 $\mu$ from the surface of the silicon substrate, i.e. in the region which is the center of the photoresist layer or nearer to the surface of the silicon substrate. This is because a uniform energy distribution is provided within the photoresist layer due to g- and h-lines of different wavelengths polymerizing in cooperation with each other. The energy distribution provided by the standing wave within the photoresist layer should preferably have a uniform energy level throughout the photoresist layer. During the development of the photoresist layer, however, several fractions of the unsensitized surface portion of the photoresist layer are removed and therefore, the region of particular interest a zigzag pattern as described above is the center portion of the photoresist layer and, in general the portion of the layer relatively nearer to the surface of the silicon substrate. Thus, the energy distribution as shown in FIG. 5 does not substantially result in the formation of wrinkles.

The above example, which employs silicon as the substrate having a reflective surface and further employs a photoresist layer formed over the silicon, has been described with respect to the preparatory step in which the photoresist layer is sensitized into a pattern and selectively removed during development, whereafter the impurities are diffused, but entirely the same effect can be achieved in the case where the semiconductor elements formed on the IC wafer are connected together by a line of aluminum. In such a case, a predetermined thickness of $SiO_2$ layer and a predetermined thickness of photoresist layer may be successively formed on the aluminum layer formed on the wafer, and then light may be applied thereto in the manner as described above. The reflection factor of the aluminum layer is substantially 100%, but any variation in the reflection factor would not involve the necessity of changing the thickness of the $SiO_2$ layer and the same result as described could be obtained.

Figure 6:
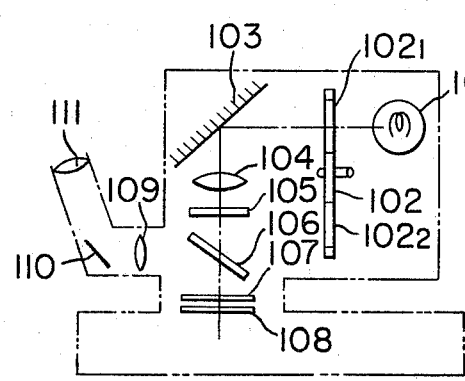
FIG. 6 schematically shows the construction of an off-contact mask type print-out device to which the present invention is applied.

FIG. 6 shows the construction of a wafer print-out device having incorporated therein the print-out system of the present invention, and more particularly a print-out device utilizing the off-contact system. The device includes a superhigh pressure mercury arc lamp 101 and a filter plate 102 having filter portions $102_1$ and $102_2$. The filter portion $102_1$ has such a filter characteristic that the wavelength transmitted therethrough is selected to a wavelength which does not sensitize the photoresist layer to be described. The other filter portion $102_2$ has the same characteristic as that of the previously described filter $2_2$. The device further includes a reflector plate 103, a collimator lens 104, a sharp cut filter 105, a half-mirror 106, a print-out mask 107, an IC semiconductor wafer 108 similar in construction to that shown in FIG. 5, and a viewfinder's optical system 109–111.

The wafer 108 and the mask 107 are spaced from each other by a distance of about 10 $\mu$, as has been described previously.

The spectral characteristic of the print-out light beam prior to its passage through the filter 105 is illustrated in FIG. 7, from which it will be seen that the filter 105 must be selected such that the levels of i-, h- and g-lines in the light emitted from the superhigh pressure mercury arc lamp 101 are adjusted to predetermined values. By premeasuring the spectral sensitivities $S\lambda_i$, $S\lambda_h$ and $S\lambda_g$ for the respective wavelengths of the photosensitive material such as photopolymerizing material applied onto the wafer in use, and by selecting the levels of the respective spectral lines such that the products of $S\lambda_i$, $S\lambda_h$, $S\lambda_g$ and $I\lambda_i$, $I\lambda_h$, $I\lambda_g$ which are the effective energies for sensitization assume predetermined values, there may be produced an optimal standing wave pattern whose region of minimum summits and valleys are located in the layer of photosensitive material so as to ensure uniform exposure to the image of the mask 107.

The filter 105 is provided for this purpose. After passing through the filter 105, the light of the excited i-, h- and g-lines of the mercury vapor have their levels corrected in the manner shown in FIG. 8, so as to provide the optimal condition above described with reference to the photosensitive layer sensitivity curve shown in broken lines.

In the above-described construction, the relative position of the mask 107 and the wafer 108 is monitored through the eyepiece 111 of the viewfinder's optical system so that their relative position is set to a predetermined position by means of an unshown aligning means, whereafter the filter 102 is rotated about its own axis so as to permit the print-out light beam to be applied through the filter portion $102_2$, thus printing out the mask image on the wafer in just the same manner as described above with respect to the previous embodiment.

Thus, according to the present invention, a light-transmitting layer optically equivalent to a photosensitive layer such as photoresist layer and having a thickness corresponding to the wavelength of the light from the illuminating light source is formed on the surface of a substrate having a reflective surface, whereby the energy components of the combined standing wave pattern resulting from the polymerization by the incident pattern light and the reflected pattern light are substantially constant in the thickness dimension within the major region of the photosensitive layer, thereby ensuring accurate print-out of the pattern to be provided on the photosensitive layer. This is highly effective to accomplish precise print-out through exposure.

At the same time, the photosensitive layer is exposed to a light energy of relatively high intensity level so that the sensitization of the photosensitive layer is effected by a predetermined energy without the exposure time exceeding a predetermined length of time. This means an advantage that even a reduced exposure time may result in uniform exposure effect, which in turn leads to an enhanced efficiency of operation.

While the invention has been described with respect chiefly to its application in the manufacture of integrated circuits, it will be apparent that the invention may equally be applicable to, for example, the photoengraving technique wherein the photosensitive layer is removed after its exposure to light.

We claim:

1. An exposure method for exposing a pattern onto a layer of photosensitive material formed on a substrate having a reflective surface, comprising the steps of:
    providing an illuminating light source means projecting light having beam components of different wavelength;
    placing said photosensitive material layer in a position for receiving an exposure pattern while said layer is spaced from said substrate by an intermediate layer of a light-transmitting material having substantially the same index of refraction as said photosensitive layer and having a thickness of the order of magnitude of the wavelength of the light projected by said light source, and
    projecting a beam from said light source through a pattern mask to produce an exposure pattern upon said photo-sensitive material,
    whereby said photosensitive material is disposed in a smoothed-out region of the standing wave pattern produced by light respectively incident on and reflected from said reflective surface of said substrate and is pattern-exposed with a substantially uniform sensitizing energy.

2. An exposure method according to claim 1, wherein said intermediate layer is a silicon dioxide layer interposed between the substrate and the photosensitive material layer.

3. An exposure method according to claim 1, further comprising the step of filtering said light beam in such a way as to relatively adjust the respective effective energies $(I\lambda_i, I\lambda_g, I\lambda_h, \ldots)$ of at least two beam components with respect to the corresponding light sensitivities $(S\lambda_i, S\lambda_g, S\lambda_h, \ldots)$ of the photosensitive material for said beam components so as to have a relation substantially defined by the following equation: $I\lambda_i S\lambda_i = I\lambda_g S\lambda_g = I\lambda_g S\lambda_h = \ldots = $ constant.

4. An exposure method according to claim 1, wherein said pattern mask is disposed in close proximity to the photosensitive material.

5. An exposure method according to claim 1, further comprising the step of projecting the exposure pattern of the mask on the photosensitive material through an image forming optical means.

6. An exposure method according to claim 3, wherein said substrate is composed essentially of silicon.

7. An exposure method according to claim 3, wherein said substrate is composed, at least in the neighborhood of the surface thereof facing said intermediate silicon dioxide layer, essentially of aluminum.

* * * * *